(12) United States Patent
Takahashi

(10) Patent No.: US 11,804,274 B2  
(45) Date of Patent: Oct. 31, 2023

(54) SHIFT REGISTER CIRCUIT, ACTIVE MATRIX SUBSTRATE, AND DISPLAY APPARATUS

(71) Applicant: SHARP KABUSHIKI KAISHA, Sakai (JP)

(72) Inventor: Yoshihisa Takahashi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/097,173

(22) Filed: Jan. 13, 2023

(65) Prior Publication Data

US 2023/0154558 A1 May 18, 2023

Related U.S. Application Data

(60) Continuation of application No. 17/865,270, filed on Jul. 14, 2022, now Pat. No. 11,587,631, which is a division of application No. 17/185,205, filed on Feb. 25, 2021, now Pat. No. 11,475,968.

(60) Provisional application No. 62/982,601, filed on Feb. 27, 2020.

(51) Int. Cl.
| | |
|---|---|
| G09G 3/36 | (2006.01) |
| G11C 19/28 | (2006.01) |
| G09G 3/20 | (2006.01) |
| G09G 3/3266 | (2016.01) |

(52) U.S. Cl.  
CPC ............... *G11C 19/28* (2013.01); *G09G 3/20* (2013.01); *G09G 3/3266* (2013.01); *G09G 3/3677* (2013.01); *G09G 2300/0408* (2013.01); *G09G 2310/0286* (2013.01); *G09G 2320/0223* (2013.01)

(58) Field of Classification Search  
CPC .... G11C 19/28; G09G 3/3266; G09G 3/3677; G09G 2300/0408; G09G 2310/0286  
See application file for complete search history.

(56) References Cited

U.S. PATENT DOCUMENTS

| | | | | |
|---|---|---|---|---|
| 8,494,109 | B2 * | 7/2013 | Ohara | G11C 19/184 377/79 |
| 11,315,496 | B2 * | 4/2022 | Xiao | G09G 3/3677 |
| 11,475,968 | B2 * | 10/2022 | Takahashi | G11C 19/28 |
| 11,587,631 | B2 * | 2/2023 | Takahashi | G11C 19/28 |

* cited by examiner

*Primary Examiner* — Patrick O Neill  
(74) *Attorney, Agent, or Firm* — ScienBiziP, P.C.

(57) ABSTRACT

A circuit includes a first transistor whose gate is connected to a set terminal and whose source or drain is connected to an internal node, a second transistor connected such that one of a source and a drain is electrically connected to the internal node and the other one of the source and the drain is electrically connected to a reference voltage source, a third transistor connected such that a gate is connected to the internal node, one of a source and a drain is connected to a clock terminal, and the other one of the source and the drain is connected to a first output terminal, a bootstrap capacitor which is connected to the internal node and the first output terminal, and a stabilization circuit that suppresses a drop in potential at the internal node in a charging period of the bootstrap capacitor.

3 Claims, 16 Drawing Sheets

SHIFT REGISTER CIRCUIT, ACTIVE MATRIX SUBSTRATE, AND DISPLAY APPARATUS

TECHNICAL FIELD

The disclosure relates to a shift register circuit, an active matrix substrate and a display apparatus, and more particularly to a shift register circuit formed on an active matrix substrate of a display apparatus.

BACKGROUND ART

In recent years, display apparatuses such as liquid crystal display apparatuses, organic EL display apparatuses, or the like including thin-film transistors (TFTs) in respective pixels have been widely used. For example, active matrix liquid crystal display apparatuses are widely used in the field of large, high-definition panels for TV applications. TFTs are produced using a semiconductor layer formed on a substrate such as a glass substrate. The substrate on which TFTs are formed is called an active matrix substrate. The active matrix substrate is also called a "cell array substrate". A plurality of TFTs are arranged in the form of a matrix such that the TFTs are disposed at respective positions where a plurality of gate bus lines and a plurality of source bus lines intersect thereby forming a display area AA on the active matrix substrate.

Peripheral circuits such as a gate driver for supplying scanning signals to gate bus lines (scanning lines), a source driver for supplying display signals to source bus lines (display signal lines), and the like may be formed in a small area on a glass substrate by using an oxide semiconductor such as low-temperature polysilicon, IGZO, or the like having a particularly high mobility characteristic. Alternatively, the peripheral circuits may be formed using amorphous silicon. The gate driver formed around a display area on a glass substrate is also called a gate driver on array (GOA) circuit. In the present description, the gate driver is also referred to as a GOA circuit. The GOA circuit is a shift register circuit including a plurality of stages connected one-to-one to the gate bus lines. The GOA circuit operates according to a plurality of clock signals such that scanning signals are sequentially output from the respective stages of the shift register circuit to corresponding gate bus lines.

PTL 1 discloses a liquid crystal display apparatus including a GOA circuit. In this GOA circuit, a circuit of each stage of the shift register includes a carry buffer transistor that independently generates a carry voltage or signal. In this configuration, a signal transmitted to a gate bus line connected to an output terminal of each stage is output separately from a carry signal transmitted to an input terminal of a next stage. This circuit configuration is described to reduce an effect of a RC delay caused by a load of a gate bus line on an input signal transmitted to the input terminal of a next following stage thereby suppressing a display defect.

CITATION LIST

Patent Literature

[PTL 1] Japanese Unexamined Patent Application Publication No. 2010-186537

SUMMARY

Technical Problem

Studying by the inventor has revealed that the GOA circuit disclosed in PTL 1 enables high-speed driving by reducing a capacitance on a node associated with the carry signal. However, as the capacitance of this node gradually decreases, a voltage fluctuation caused by a parasitic capacitance of each of a plurality of transistors included in each stage of the circuit becomes relatively large, and as a result, an operation failure due to a ripple of an input signal may easily occur.

In view of the above problem, an object of the present disclosure is to improve an operation stability of a GOA circuit by reducing a voltage drop at an internal node that may occur due to a ripple of an input signal.

Solution to Problem

The present description discloses solutions described in the following items.

[Item 1]

A shift register circuit including a plurality of stages configured to generate scanning signals to be supplied to a plurality of scanning lines of a display apparatus, a circuit of one of the plurality of stages including a clock terminal for inputting a clock signal, a set terminal for inputting a set signal, a reset terminal for inputting a reset signal, a first output terminal for outputting a scanning signal, the first transistor whose gate is electrically connected to the set terminal and whose source or drain is electrically connected to an internal node, a second transistor whose source and drain are electrically connected such that one of the source and the drain is electrically connected to the internal node and the other one of the source and the drain is electrically connected to a reference voltage source, a third transistor whose gate, source and drain are electrically connected such that the gate is electrically connected to the internal node, one of the source and the drain is electrically connected to the clock terminal, and the other one of the source and the drain is electrically connected to the first output terminal, a bootstrap capacitor one end of which is electrically connected to the internal node and the other end of which is electrically connected to the first output terminal, and a stabilization circuit configured to suppress a drop in potential at the internal node that may occur due to a ripple of the reset signal in a charging period of the bootstrap capacitor.

[Item 2]

The shift register circuit according to Item 1, wherein the reset signal is input to the gate of the second transistor, and the stabilization circuit includes a fourth transistor to lower a voltage level of the reset signal down to the reference voltage during the charging period.

[Item 3]

The shift register circuit according to Item 2, wherein a gate of the fourth transistor is electrically connected to the internal node, one of a source and a drain of the fourth transistor is electrically connected to the reset terminal, and the other one of the source and the drain is electrically connected to the reference voltage source.

[Item 4]

The shift register circuit according to Item 2, wherein a gate of the fourth transistor is electrically connected to the first output terminal, one of a source and a drain of the fourth transistor is electrically connected to the reset terminal, and the other one of the source and the drain is electrically connected to the reference voltage source.

[Item 5]

The shift register circuit according to Items 3 or 4, further including a second output terminal configured to output a signal to drive a different stage at a same timing as a timing of outputting the scanning signal from the first output terminal, wherein the signal is output from a circuit of a certain stage of the plurality of stages and is input to a circuit of the different stage as a set signal or reset signal, and a fifth transistor whose gate, source and drain are electrically connected such that the gate is electrically connected to the internal node, one of the source and the drain is electrically connected to the clock terminal, and the other one of the source and the drain is electrically connected to the second output terminal.

[Item 6]

The shift register circuit according to Item 2, further including a second output terminal configured to output a signal to drive a different stage at a same timing as a timing of outputting the scanning signal from the first output terminal, wherein the signal is output from a circuit of a certain stage of the plurality of stages and is input to a circuit of the different stage as a set signal or reset signal, and a fifth transistor whose gate, source and drain are electrically connected such that the gate is electrically connected to the internal node, one of the source and the drain is electrically connected to the clock terminal, and the other one of the source and the drain is electrically connected to the second output terminal, wherein a gate of the fourth transistor is electrically connected to the second output terminal, one of a source and a drain of the fourth transistor is electrically connected to the reset terminal, and the other one of the source and the drain is electrically connected to the reference voltage source.

[Item 7]

The shift register circuit according to item 1, further including a sixth transistor whose gate, source, and drain are electrically connected such that the gate is electrically connected to the reset terminal, one of the source and the drain is electrically connected to the first output terminal, and the other one of the source and the drain are electrically connected to the reference voltage source, wherein the stabilization circuit includes a seventh transistor configured to lower a voltage level of the reset signal input to the gate of the sixth transistor down to the reference voltage during the charging period.

[Item 8]

The shift register circuit according to Item 7, wherein a gate, a source, and a drain of the seventh transistor are electrically connected such that the gate is electrically connected to the internal node, one of the source and the drain is electrically connected to the reset terminal, and the other one of the source and the drain is electrically connected to the reference voltage source.

[Item 9]

The shift register circuit according to Item 7, wherein a gate, a source, and a drain of the seventh transistor are electrically connected such that the gate is electrically connected to the first output terminal, one of the source and the drain is electrically connected to the reset terminal, and the other one of the source and the drain is electrically connected to the reference voltage source.

[Item 10]

The shift register circuit according to Item 8 or 9, further including a second output terminal configured to output a signal to drive a different stage at a same timing as a timing of outputting the scanning signal from the first output terminal, wherein the signal is output from a circuit of a certain stage of the plurality of stages and is input to a circuit of the different stage as a set signal or reset signal, and an eighth transistor whose gate, source and drain are electrically connected such that the gate is electrically connected to the internal node, one of the source and the drain is electrically connected to the clock terminal, and the other one of the source and the drain is electrically connected to the second output terminal.

[Item 11]

The shift register circuit according to item 7, further including a second output terminal configured to output a signal to drive a different stage at a same timing as a timing of outputting the scanning signal from the first output terminal, wherein the signal is output from a circuit of a certain stage of the plurality of stages and is input to a circuit of the different stage as a set signal or reset signal, and an eighth transistor whose gate, source and drain are electrically connected such that the gate is electrically connected to the internal node, one of the source and the drain is electrically connected to the clock terminal, and the other one of the source and the drain is electrically connected to the second output terminal, wherein a gate, a source, and a drain of the seventh transistor are electrically connected such that the gate is electrically connected to the second output terminal, one of the source and the drain is electrically connected to the reset terminal, and the other one of the source and the drain is electrically connected to the reference voltage source.

[Item 12]

The shift register circuit according to Item 1, further including a second output terminal configured to output a signal to drive a different stage at a same timing as a timing of outputting the scanning signal from the first output terminal, wherein the signal is output from a circuit of a certain stage of the plurality of stages and is input to a circuit of the different stage as a set signal or reset signal, an eighth transistor whose gate, source and drain are electrically connected such that the gate is electrically connected to the internal node, one of the source and the drain is electrically connected to the clock terminal, and the other one of the source and the drain is electrically connected to the second output terminal, and a sixth transistor whose gate, source, and drain are electrically connected such that the gate is electrically connected to the reset terminal, one of the source and the drain is electrically connected to the second output terminal, and the other one of the source and the drain are electrically connected to the reference voltage source, wherein the stabilization circuit includes a seventh transistor configured to lower a voltage level of the reset signal input to the gate of the sixth transistor down to the reference voltage during the charging period.

[Item 13]

The shift register circuit according to one of Items 7 to 12, wherein a reset signal different from the reset signal input to the gate of the sixth transistor is input to the gate of the second transistor.

[Item 14]

An active matrix substrate including the shift register circuit according to one of Items 1 to 13.

[Item 15]

A display apparatus including the active matrix substrate according to Item 14.

Advantageous Effects of Disclosure

Illustrative embodiments of the present disclosure provide a GOA circuit capable of improving the stability of circuit operation by reducing a voltage drop at an internal node that may occur due to a ripple of an input signal.

DESCRIPTION OF EMBODIMENTS

Figure 1:
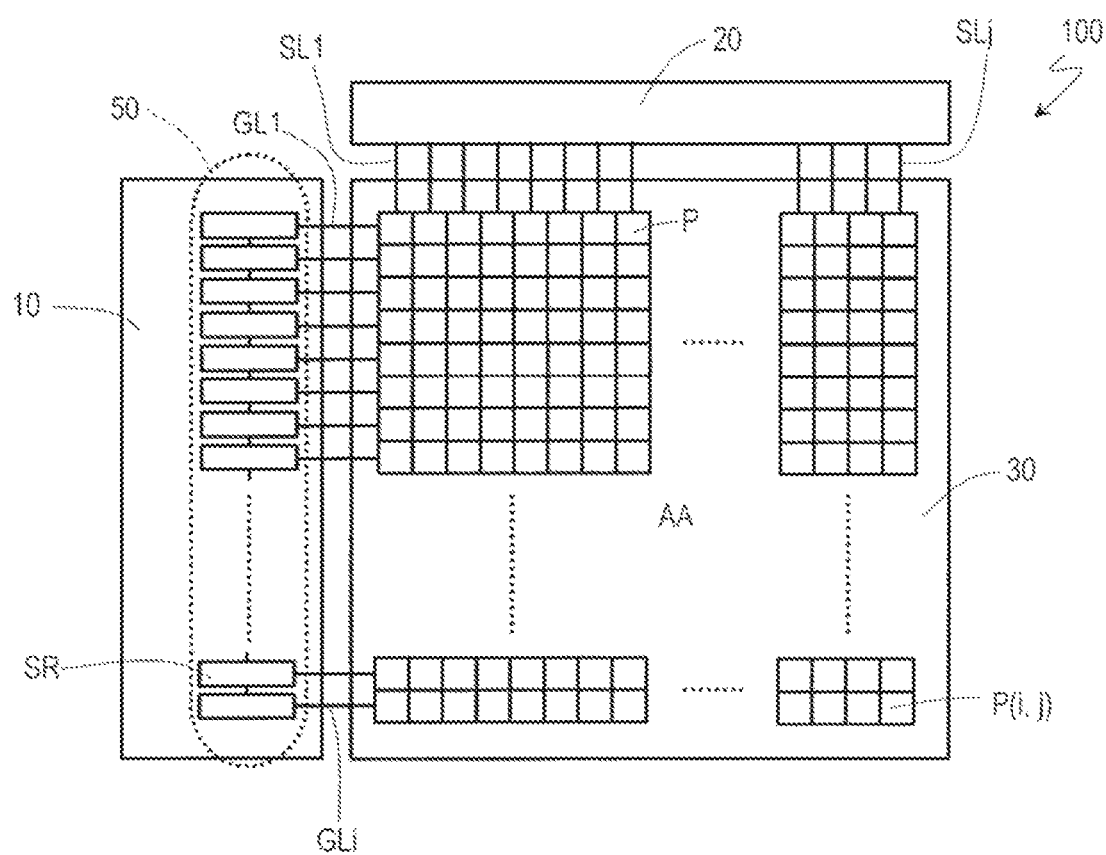
FIG. 1 is a schematic diagram illustrating an example of a configuration of a display apparatus including an active matrix substrate including a shift register circuit according to the present disclosure.

According to a non-limiting and illustrative embodiment, the present disclosure provides a shift register circuit which is a GOA circuit including a plurality of stages that generate scanning signals to be supplied to a plurality of scanning lines of a display apparatus. A circuit of each of the plurality of stages includes a clock terminal for inputting a clock signal, a set terminal for inputting a set signal, a reset terminal for inputting a reset signal, a first output terminal for outputting a scanning signal, a first transistor whose gate is electrically connected to the set terminal and whose source or drain is electrically connected to an internal node, a second transistor whose source and drain are electrically connected such that one of the source and the drain is electrically connected to the internal node and the other one of the source and drain is electrically connected to a reference voltage source, a third transistor whose gate, source and drain are electrically connected such that the gate is electrically connected to the internal node, one of the source and the drain is electrically connected to the clock terminal, and the other one of the source and drain is electrically connected to the first output terminal, a bootstrap capacitor one end of which is electrically connected to the internal node and the other end of which is electrically connected to the first output terminal, and a stabilization circuit. The stabilization circuit includes at least one transistor for suppressing a drop in potential at the internal node that may occur due to a ripple of the reset signal in a charging period of the bootstrap capacitor. The stabilization circuit does not necessarily have to be provided in all the circuits of the plurality of stages. The shift register circuit may be configured so that only some of the circuits in some stages of the plurality of stages are equipped with the stabilization circuit, and circuits in stages other than the said some stages are not equipped with the stabilization circuit.

The transistors in each stage of the shift register circuit are switch elements, which are typically TFTs. The TFTs may be of n type or p type. In the embodiment described herein, it is assumed by way of example that the transistors are n-type TFTs, and an electrical connection configuration of a GOA circuit is described below for a case where n-type TFTs are used. Note that the electrical connections of the sources and drains of the p-type transistors are opposite to the electrical connections of the sources and drains of the n-type transistors. The reference voltage VSS may be set to, for example, −6 V or −12 V.

A multiphase clock signal, such as a four-phase, six-phase or eight-phase clock signal, is used as the clock signal. An output signal from a circuit of one stage of the shift register circuit is input, as a set signal or a reset signal, to a circuit of a different stage. The reset signal is not limited to a single signal, but a plurality of reset signals may be input to each stage of the circuit. For example, two reset signals may be input to each stage of the circuit.

With reference to the accompanying drawings, embodiments of the disclosure are described below. Note that in the following description, too detailed explanations may be omitted. For example, detailed explanations of already well-known matters or duplicate explanations on substantially identical configurations may be omitted. This is to avoid the following description being unnecessarily redundant and to facilitate the understanding of those skilled in the art. The present inventor provides the accompanying drawings and the following description in order for those skilled in the art to fully understand the present disclosure. Note that it is not intended to limit the subject matter defined in the claims by these accompanying drawings and following description. In the following description, the same or similar components are denoted by the same reference numerals.

FIG. 1 is a schematic diagram illustrating an example of a configuration of a display apparatus 100 including an active matrix substrate including a shift register circuit according to the present disclosure. The display apparatus 100 is, for example, an active matrix liquid crystal display apparatus. The display apparatus 100 includes a gate bus driver 10 including a shift register circuit 50, a source driver 20, and a display panel 30 including a translucent active matrix substrate. The gate bus driver is also referred to as a "scanning signal line drive circuit" and the source driver is also referred to as a "display signal line drive circuit". The gate bus driver (GOA circuit) 10 is formed, on the active matrix substrate in an outer periphery of a display area AA, using, for example, amorphous silicon, polycrystalline silicon, microcrystalline silicon or an oxide semiconductor.

The display panel 30 includes a plurality of pixels P disposed in a matrix form having i rows and j columns (i, j are each an integer equal to or greater than 2) on the active matrix substrate. Each of the plurality of pixels P includes a TFT and a pixel capacitance for holding a pixel voltage. For example, full HD (High Definition) TVs have 1,920×1,080 pixels, while 4K TVs have 3,840×2,160 pixels.

The gate bus driver 10 and the display panel 30 are electrically connected via i gate bus lines GL1 to GLi. More specifically, a group of j pixels located in the same row are electrically connected to circuits of respective stages of the shift register circuit 50 in the gate bus driver 10 via a common gate bus line. For example, in a Full HD TV, the shift register circuit 50 include 1,080 stages corresponding to the number of pixels in the row direction, and is electrically connected to the display panel 30 via 1,080 gate bus lines.

The source driver 20 and the display panel 30 are electrically connected via j source bus lines SL1 to SLj. More specifically, a group of i pixels located in the same column are electrically connected to the source driver 20 via a common source bus line. For example, in a Full HD TV, the source driver 20 is electrically connected to the display panel 30 via 1920 source bus lines.

The gate bus driver 10 includes the shift register circuit 50, that is, the GOA circuit, formed on the active matrix substrate. The shift register circuit 50 includes a plurality of stages that generate scanning signals to be supplied to a plurality of gate bus lines of the display apparatus 100. Hereinafter, the plurality of stages are referred to as a "shift register group" and the circuit of each of the plurality of stages is referred to as a "shift register SR". That is, the shift register circuit 50 includes i shift registers SR. Each shift register SR is electrically connected to a group of j pixels located in the corresponding row via the gate bus line GLi to provide a common scanning signal to the group of j pixels.

The shift register circuit 50 generates scanning signals based on a gate start pulse signal, a gate end pulse signal, a clock signal, and the like output from a display control circuit (not shown), and outputs the scanning signals sequentially to the respective i gate bus lines GL1 to GLi. The scanning signal is output to each gate bus line every one vertical scanning period.

The source driver 20 generates a video signal for driving pixels based on a digital video signal, a source start pulse signal, a source clock signal, and other signals output from the display control circuit (not shown), and supplies the generated video signal to each of the j source bus lines SL1 to SLj.

First Embodiment

Figure 2:
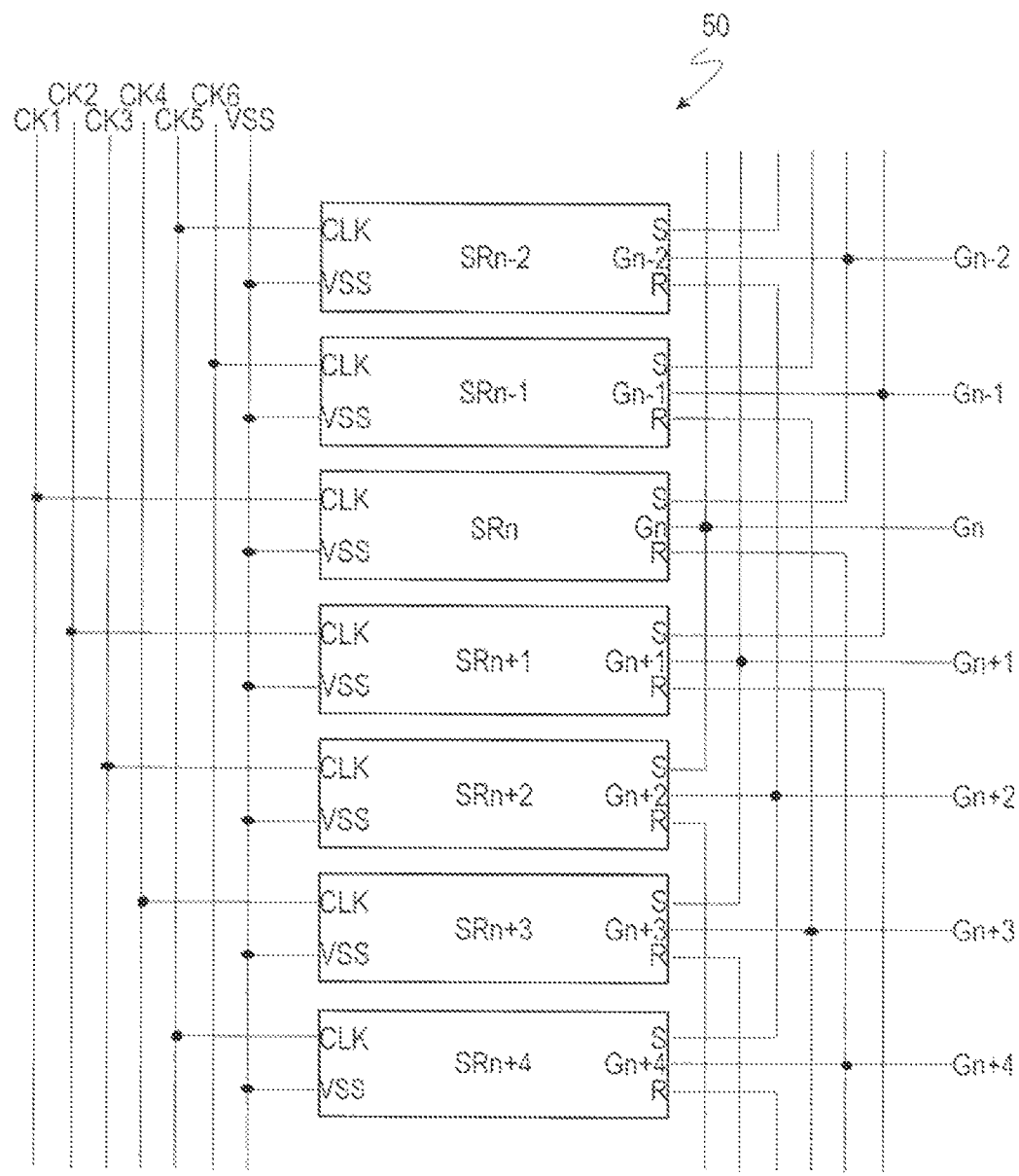
FIG. 2 is a circuit diagram illustrating an example of electrical connection of shift register groups in a shift register circuit according to a first illustrative embodiment.

FIG. 2 is a circuit diagram illustrating an example of electrical connection of shift register groups in the shift register circuit 50. In FIG. 2, among i shift register groups, seven shift registers SRs from (n−2)th to (n+4)th shift registers SR (n is an integer satisfying 3≤n≤i−4) are shown. The shift register SRn has input terminals including a clock terminal CLK, a reference voltage terminal VSS, a set terminal S, and a reset terminal R, and has an output terminal Gn as an output terminal. Note that the shift register SRn is the nth shift register among the i shift registers. In the present description, for convenience of explanation, terminals and signals input/output to/from terminals may be denotes same reference symbols.

In the present embodiment, six-phase clock signals CK1 to CK6 are used as the clock signals input to the shift register circuit 50. In the example shown in FIG. 2, the clock signal CK1 is input to the clock terminal CK of the shift register SRn. The clock signal CK2 is input to the clock terminal CK of the shift register SRn+1. The clock signal CK3 is input to the clock terminal CK of the shift register SRn+2. The clock signal CK4 is input to the clock terminal CK of the shift register SRn+3. The clock signal CK5 is input to the clock terminal CK of the shift register SRn−2. The clock signal CK6 is input to the clock terminal CK of the shift register SRn−1. The signal of the reference voltage VSS is input in common to all the shift registers SR.

To each shift register SR, a scanning signal output as an output signal from a shift register SR of a different stage is input as a set signal or a reset signal. In the example shown in FIG. 2, an output signal (or a scanning signal) from the shift register SRn is input as a set signal to a shift register SRn+2 at a location two stages after the shift register SRn. An output signal Gn+4 from the shift register SRn+4 is input as a reset signal to the shift register SRn at a location four stages before the shift register Gn+4.

The output signal Gn output from the shift register SRn is supplied to a group of pixels located in an nth row via the corresponding gate bus line GLn.

Figure 3:
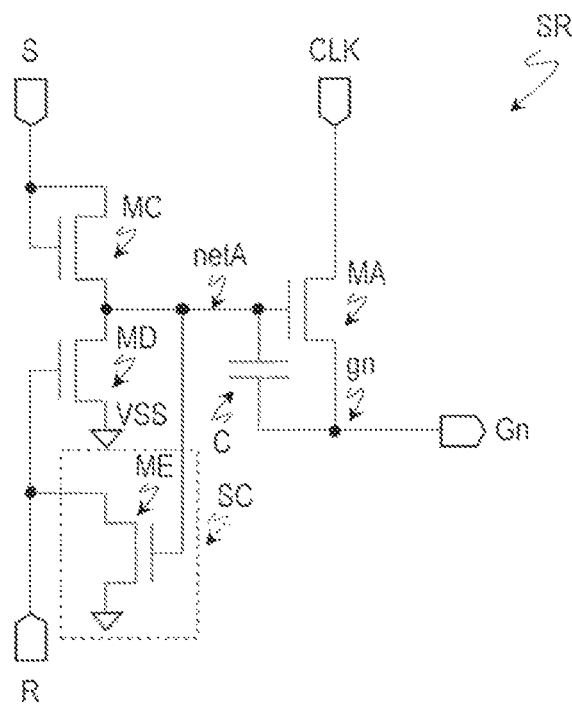
FIG. 3 is a circuit diagram illustrating an example of a configuration of a shift register according to the first illustrative embodiment.

FIG. 3 is a circuit diagram illustrating an example of a configuration of the shift register SR. In the example shown in FIG. 3, the shift register SR includes a first transistor MC, a second transistor MD, a third transistor MA and a capacitor C. Hereinafter, the first transistor MC, the second transistor MD, and the third transistor MA are respectively referred to simply as the "transistor MC", the "transistor MD", and the "transistor MA".

The transistor MC and the transistor MD are connected in series. The transistor MC, the transistor MD, the transistor MA, and the capacitor C are electrically connected via a common node.

This common node is referred to as an "internal node netA". The transistor MA, the capacitor C, and the output terminal Gn are electrically connected via a common node. This common node is referred to as an "output node gn". The transistor MC has a function of raising the potential of the internal node netA, and the transistor MD has a function of lowering the potential of the internal node netA. In the present embodiment, the potential of each node is given with respect to a reference potential. Note that it may be allowed to provide different reference voltages to the respective nodes.

The gate and the drain of the transistor MC are diode-connected and electrically connected to the set terminal S. The source of the transistor MC is electrically connected to the drain of the transistor MD. The source of the transistor MD is electrically connected to a reference voltage source. The gate of the transistor MD is electrically connected to the reset terminal R.

The transistor MA outputs the voltage of the clock signal CLK to the output terminal Gn. The gate of the transistor MA is electrically connected to the internal node netA. The drain of the transistor MA is electrically connected to the clock terminal CLK and the source is electrically connected to the output terminal Gn (or the output node gn).

The capacitor C is a so-called bootstrap capacitor which holds the potential of the internal node netA, which rises when the transistor MC is in the on-state. One end of the capacitor C is electrically connected to the internal node netA and the other end is electrically connected to the output terminal Gn (or the output node gn).

In the present embodiment, the stabilization circuit SC includes a fourth transistor ME, which suppresses a drop in the potential of the internal node netA that may occur due to a ripple of the reset signal R input to the gate of the transistor MD during a charging period of the capacitor C. Hereinafter, the fourth transistor ME is referred to simply as the "transistor ME".

The transistor ME lowers the voltage level of the reset signal R down to the reference voltage VSS during the charging period of the capacitor C. The drain of the transistor ME is electrically connected to the reset terminal R, the gate of the transistor ME is electrically connected to the internal node netA, and the source of the transistor ME is electrically connected to the reference voltage source.

Figure 4:
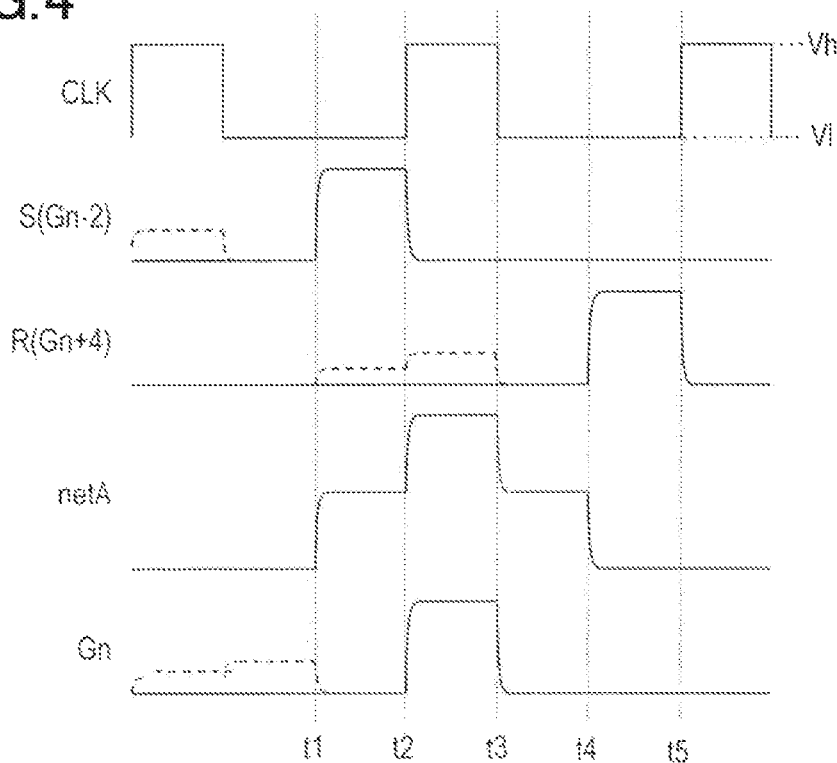
FIG. 4 is a timing chart illustrating an example of an operation of a shift register according to the first illustrative embodiment.

With reference to FIG. 4, an operation of the shift register SR is described in detail. FIG. 4 is a timing chart illustrating an example of an operation of the shift register SR. In this timing chart, the period of the clock signal CLK is 6H (where H is one horizontal scanning period), and the period of the high level Vh of the clock signal CLK is 2H. The duty ratio (the ratio of the period of high level Vh to the one period) of the clock signal CLK is ⅓. The low level V1 corresponds to the voltage level of the reference voltage source, which may be set to, for example, −6V The length of 1H may be, for example, 14.8 us or 7.4 us.

At time t1, the set signal S changes from a logical low level to a high level. Herein, a change of a signal from a logical low level to a high level is referred to as rising, and a change of a signal from the logical high level to the low level is referred to as falling. The set signal S is an output signal Gn−2, which is output from the shift register SRn−2 at a location two stages before the shift register SRn. When the set signal S rises, the transistor MC turns on and charging (pre-charging) of the capacitor C is started. As a result, the potential of the internal node netA changes to a precharge voltage. The precharge voltage is given by a voltage of the set signal S (the high level Vh) minus a threshold voltage (Vth) of the transistor MC. This causes the transistor MA to turn on. A period from time t1 to time t2 is referred to as a "set period". During the set period, the clock signal CLK is at the low level, and thus the signal output from the transistor MA is at the low level. That is, the output signal Gn remains at the low level without change.

At time t2, the clock signal CLK rises. When the clock signal CLK rises, the potential of the internal node netA rises. In this state, the transistor MC turns off regardless of the voltage level of the set signal S. This is because the source potential of the transistor MC increases and thus the gate potential becomes relatively low. In the example shown in FIG. 4, the set signal S falls and the transistor MC turns off. Because the reset signal R remains at the low level, the transistor MD remains in the off state. As a result, the internal node netA goes into a floating state. When the clock signal CLK rises at time t2, an electric charge stored in the capacitor C causes a voltage to be held across the capacitor C, that is, the potential difference between the internal node netA and the output node gn is held by the charge stored in the capacitor C. Therefore, as the potential of the drain of the transistor MA rises, the potential of the internal node netA rises accordingly to a level equal to or higher than the input voltage. Thus, the internal node netA is bootstrapped. The bootstrapping causes the potential of the internal node netA to rise to a level even higher than the high level Vh of the clock signal CLK. As a result, the transistor MA is maintained in the on-state, which causes the signal level output from the transistor MA to be in the high level. The period from time t2 to time t3 with a length equal to 2H is referred to as a "bootstrap period". During the bootstrap period, a high-level output signal Gn is output. The charging period of capacitor C is equal to the set period plus the bootstrap period.

At time t3, the clock signal CLK falls. In this case, the transistor MA remains in the on-state. The potential of the drain of the transistor MA decreases, and the potential of the output node gn decreases accordingly. As the potential of the output node gn decreases, the potential of the internal node netA also decreases to a level equal to that in the set period. A period from time t3 to t4 is referred to as a "bootstrap release period".

At time t4, the reset signal R rises, which causes the transistor MD to turn on. The reset signal R is an output signal Gn+4, which is output from the shift register SRn+4 at a location four stages s after the shift register SRn of interest. The electric charge held in capacitor C is discharged and the potential at the internal node netA falls to a low level V1 and is reset. A period from time t4 to time t5 is referred to as a "reset period".

Investigation by the inventor has led to the following findings. A potential drop at the internal node netA can easily occur in the period from time t2 to time t4 during which no electric charge is supplied to the internal node netA, that is, the internal node netA is in the floating state, and a potential drop of the internal node netA occurring in the period from time t2 to time t3, which corresponds to the signal output period, can be one of causes of a display failure. In order to obtain a sufficient voltage at the timing when the output signal (that is, the scanning signal) is output from the output terminal Gn, bootstrapping is performed with the electric charge held in the capacitor C to raise the potential at the internal node netA to a level equal to or higher than the input signal. When bootstrapping is performed, the internal node netA is in the floating state. Therefore, in the bootstrapping, if the reset signal R is unstable, the potential of the internal node netA can drop via the transistor MD. As a result, a sufficient output voltage is not obtained from the transistor MA. Therefore, when the output signal Gn is output, it is necessary to fix the reset signal R stably to the low level. However, a parasitic capacitance exists in the transistor MD, and a ripple indicated by a dashed-line waveform in the timing chart in FIG. 4 can occur due to the parasitic capacitance. In the period in which the potential of the internal node netA changes, a ripple can be easily superimposed, via the parasitic capacitance of the transistor MD, on the set signal S, the reset signal R, and the output signal Gn.

In the present embodiment, as described above, the transistor ME is in the on-state during the charging period of the bootstrap capacitor, and thus the reset signal R is fixed to the reference voltage VSS. Thus, even if a ripple occurs on the reset signal R in this period, the reset signal R is fixed at the low level because the transistor ME is turned on. Thus, the transistor MD is avoided from accidentally turning on. As a result, the ripple that can occur at the internal node netA is suppressed and the output signal Gn is sufficiently obtained.

Figure 5:
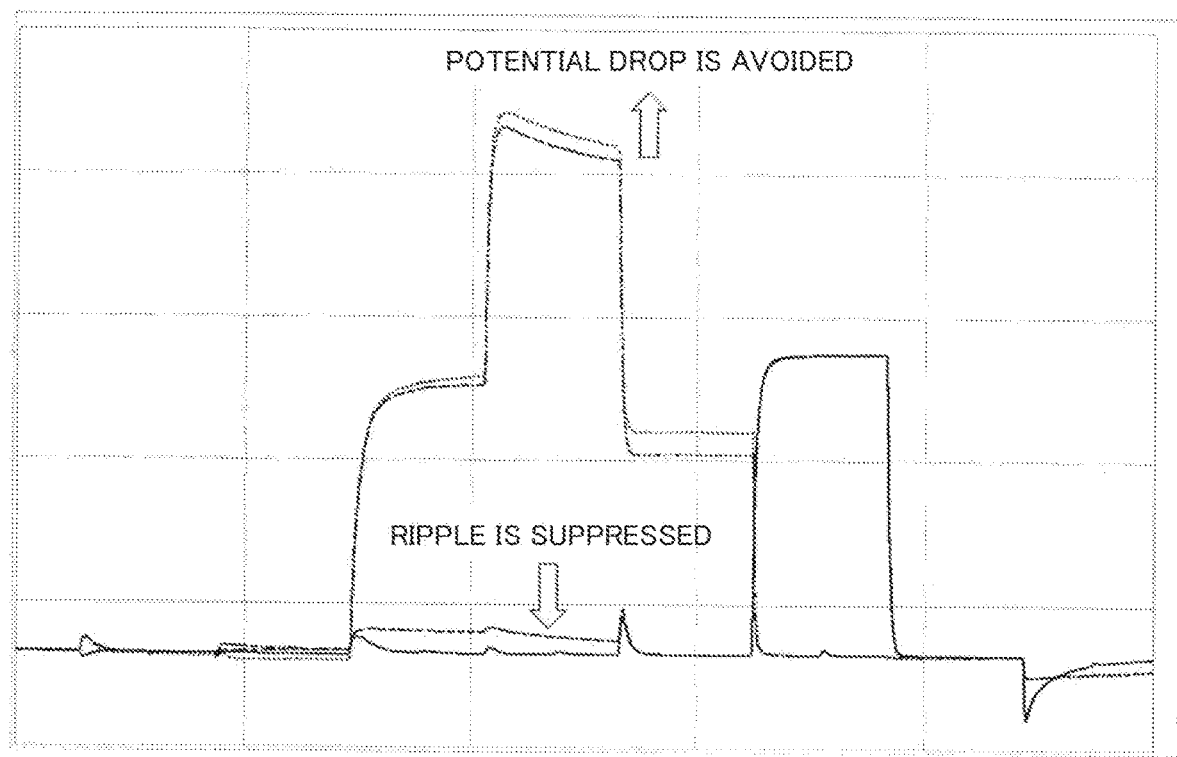
FIG. 5 is a graph illustrating a simulation result.

The inventor had verified the operation of the stabilization circuit SC according to the present embodiment by using an electronic circuit simulator. FIG. 5 is a graph showing a simulation result. In FIG. 5, a waveform of the reset signal R is represented by a solid line and a change in the potential at the internal node netA is represented by a dotted line. A simulation result is also shown, as a comparative example, for a case where the shift register SR does not have the stabilization circuit SC including the transistor ME. A waveform of the reset signal R in the comparative example is represented by a dashed line, and a change in the potential of the internal node netA is represented by a double-dotted line.

In the comparative example, when the potential at the internal node netA is raised by the bootstrapping, a ripple occurs on the reset signal R. This results in a reduction in the potential of the internal node netA. In contrast, in the case where the stabilization circuit SC according to the present embodiment is provided, the ripple occurring on the reset signal R at the above timing is suppressed, and as a result, the decrease in the potential at the internal node net A is suppressed.

Figure 6:
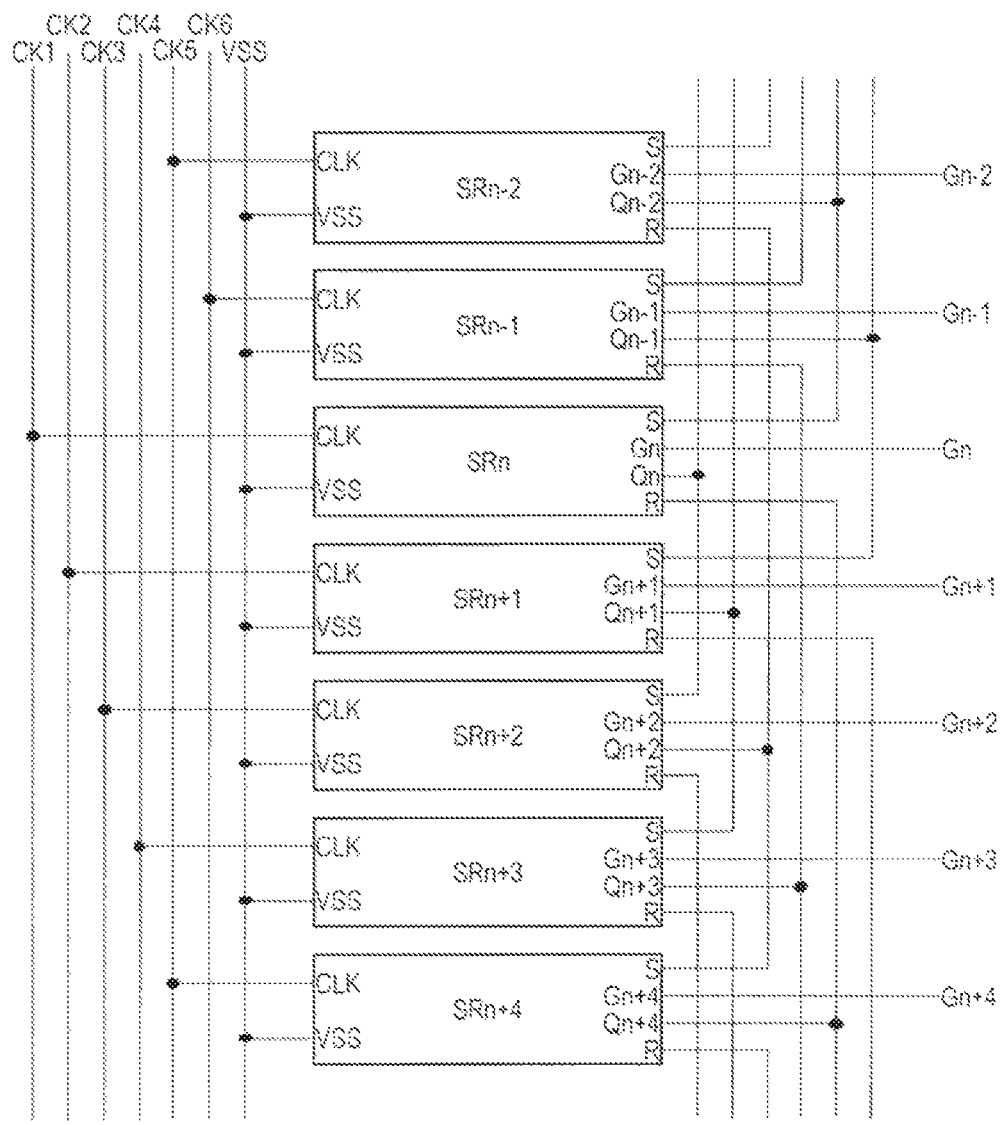
FIG. 6 is a circuit diagram illustrating another example of electrical connection of shift register groups in a shift register circuit according to the first illustrative embodiment.
Figure 7:
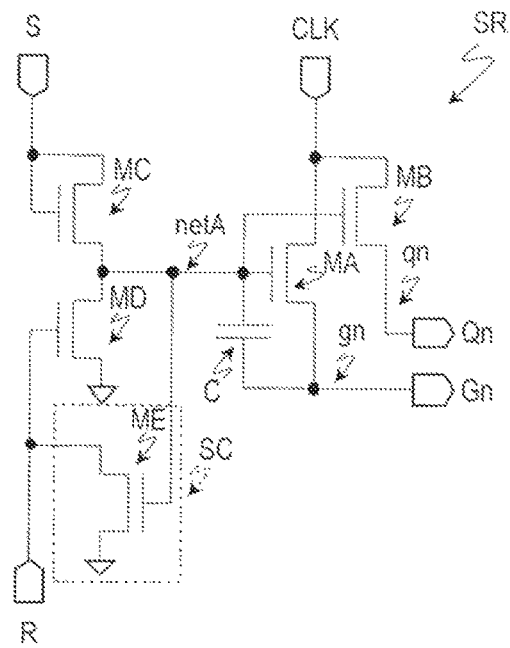
FIG. 7 is a circuit diagram illustrating another example of a configuration of a shift register according to the first illustrative embodiment.
Figure 8:
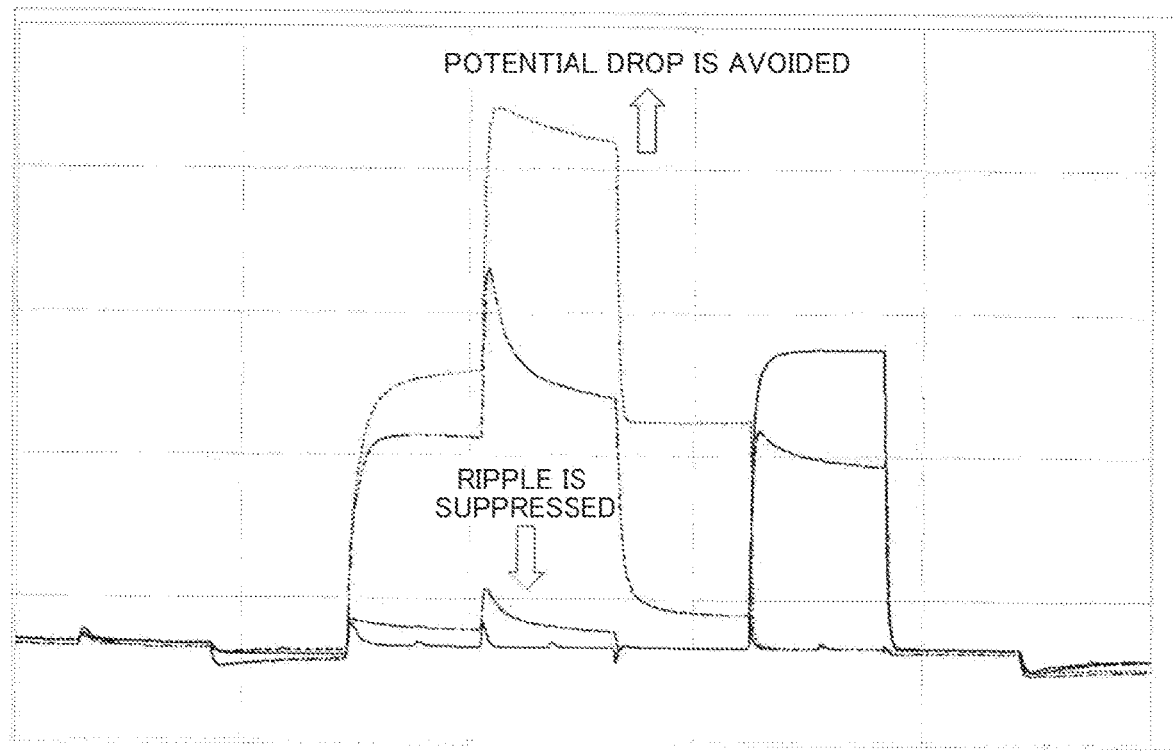
FIG. 8 is a graph illustrating a simulation result.

Referring to FIGS. 6 to 8, other examples of the circuit configuration of the shift register SR according to the present embodiment are described. FIG. 6 is a circuit diagram illustrating an example of electrical connection of shift register groups in the shift register circuit 50. In FIG. 6, among i shift register groups, seven shift registers SRs from (n−2)th to (n+4)th shift registers SR (n is an integer satisfying 3≤n≤i−4) are shown. The shift register SRn has input terminals including a clock terminal CLK, a reference voltage terminal VSS, a set terminal S, and a reset terminal R, and has output terminals including a first output terminal Gn and a second output terminal Qn. Hereinafter, the first output terminal Gn and the second output terminal Qn are respectively referred to simply as the "output terminal Gn" and the "output terminal Qn". FIG. 7 is a circuit diagram illustrating another example of a configuration of the shift register SR. In the following description, explanations of configurations and operations common to those of the shift register SR shown in FIG. 3 will be omitted, and the explanations will focus on differences from them.

In FIG. 7, the shift register SR includes two output terminals Gn and Qn. One output terminal Gn is for supplying a scanning signal to a corresponding gate bus line. The other output terminal Qn is for outputting a drive signal Qn to a shift register SR at a different stage. More particularly, the output terminal Qn outputs the drive signal Qn that is input, as a set signal S or a reset signal R, to the shift register SR at the different stage. As described above, unlike the shift register SR shown in FIG. 3, the output terminal Qn for outputting the drive signal Qn for driving the shift register SR of the different stage is provided separately from the output terminal Gn for outputting the scanning signal.

To each shift register SR, a drive signal output from an output terminal Qn of a shift register SR of a different stage is input as a set signal S or a reset signal R. In the example shown in FIG. 6, the drive signal Qn output from the output terminal Qn of the shift register SRn is input, as the set signal S, to the shift register SRn+2 at a location two stages after the shift register SRn of interest. The drive signal Qn+4, which is output from the output terminal Qn+4 of the shift register SRn+4, is input as the reset signal R to the shift register SRn at a location four stages before the shift register Qn+4.

As shown in FIG. 7, the shift register SR may further include a fifth transistor MB. Hereinafter, the fifth transistor MB is referred to simply as the "transistor MB". The transistor MB outputs a drive signal Qn for driving the shift register SR at a different stage at the same time as the transistor MA outputs the scanning signal as the output signal Gn. The gate of the transistor MB is electrically connected to the internal node netA. The drain of the transistor MB is electrically connected to the clock terminal CLK, and the source is electrically connected to the output terminal Qn. The node connecting the source of the transistor MB and the output terminal Qn is referred to as an "output node qn".

For example, in a high-definition display apparatus, as the number of pixels in a horizontal direction increases, the wiring length of the gate bus line in a display area AA increases, which causes a panel load to increase. For this reason, the capacity Cg at the output node gn connected to the gate bus line tends to be large. On the other hand, the capacity Cq at the output node qn is smaller than the capacity Cg. Therefore, even when the panel load is large, by inputting the drive signal Qn output from the output terminal Qn of the shift register SR, as the set signal S or the reset signal R, to the shift register SR at a different stage, it becomes possible to drive the shift register circuit 50 at a higher speed. However, the capacitance Cq is relatively small, and this causes the output node qn to be susceptible to ripple effects. Thus, the reset signal R is likely to have a ripple. According to the present embodiment, by the provision of the transistor ME in the stabilization circuit SC, it becomes possible to properly suppress the ripple that may occur on the reset signal R. That is, it becomes possible to achieve high-speed driving of the shift register circuit 50 by using the drive signal Qn while appropriately reducing the drop in the potential of the internal node netA and stabilizing the output signal Gn.

The inventor had verified the operation of the shift register SR shown in FIG. 7 by using an electronic circuit simulator. FIG. 8 is a graph showing a simulation result. In FIG. 8, a waveform of the reset signal R (that is, Qn+4) is represented by a solid line and a change in the potential at the internal node netA is represented by a dotted line. A simulation result is also shown, as a comparative example, for a case where the shift register SR does not have the stabilization circuit SC including the transistor ME. A waveform of the reset signal R in the comparative example is represented by a dashed line, and a change in the potential of the internal node netA is represented by a double-dotted line.

In the comparative example, a large ripple occurs in the reset signal R in the charging period of the capacitor C, which results in a large drop in the potential at the internal node netA. In contrast, in the case where the stabilization circuit SC according to the present embodiment is provided, the ripple occurring in the reset signal R is suppressed, and as a result, the decrease in the potential at the internal node netA is properly suppressed.

Figure 9A:
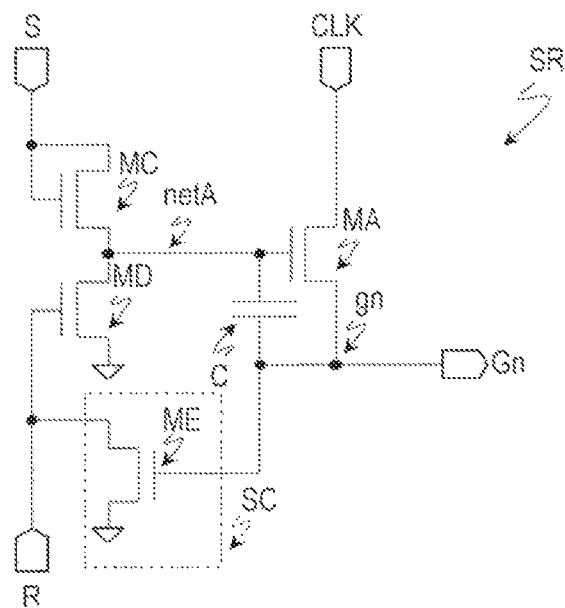
FIG. 9A is a circuit diagram illustrating still another example of a configuration of a shift register according to the first illustrative embodiment.
Figure 9B:
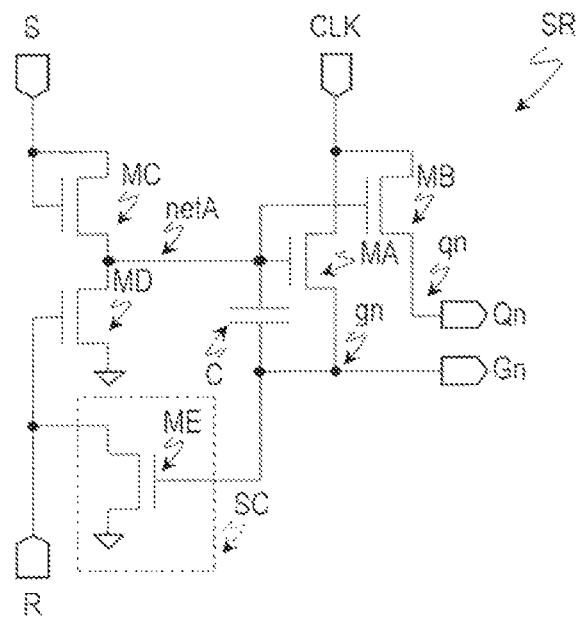
FIG. 9B is a circuit diagram illustrating still another example of a configuration of a shift register according to the first illustrative embodiment.
Figure 9C:
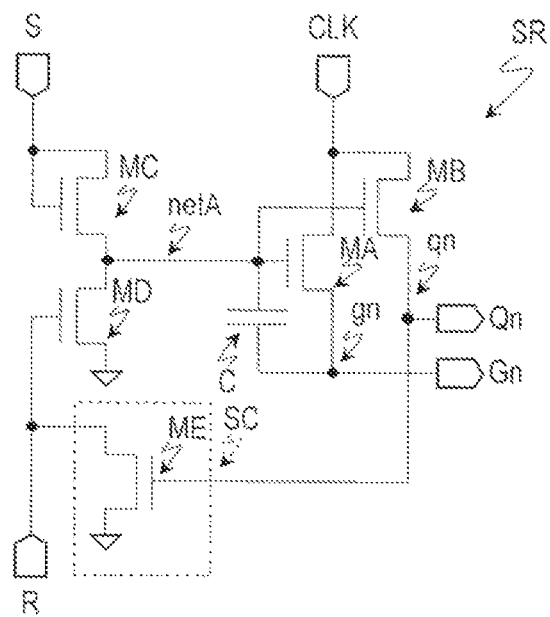
FIG. 9C is a circuit diagram illustrating still another example of a configuration of a shift register according to the first illustrative embodiment.

FIGS. 9A to 9C illustrate further examples of the circuit configuration of the shift register SR. In these examples of the configuration, the gate of the transistor ME is connected to the output node gn or qn. More specifically, in the example of the circuit configuration illustrated in FIG. 9A, the gate of the transistor ME is electrically connected not to the internal node netA but to the output node gn. In the example of the circuit configuration illustrated in FIG. 9B, a transistor MB that outputs a drive signal Qn is provided, and the gate of the transistor ME is electrically connected to the output node gn. In the example of the circuit configuration illustrated in FIG. 9C, a transistor MB that outputs a drive signal Qn is provided, and the gate of the transistor ME is electrically connected to the output node qn.

Figure 10:
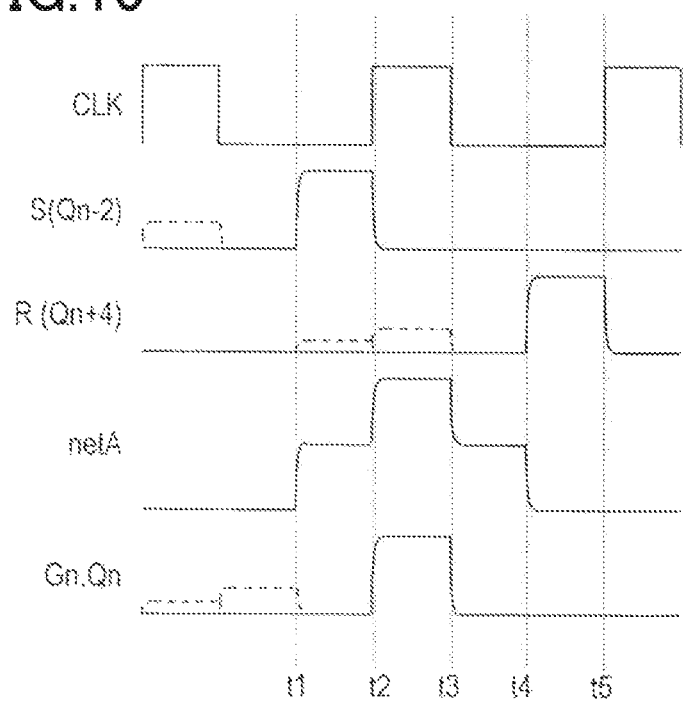
FIG. 10 is a timing chart illustrating another example of an operation of a shift register according to the first illustrative embodiment.

FIG. 10 is a timing chart showing an example of an operation of the shift register SR shown in FIG. 9A, FIG. 9B or FIG. 9C. In this example, the drive signal Qn−2, which is output from the shift register SRn−2 at a location two stages before, is input as the set signal S, and the drive signal Qn+4, which is output from the shift register SRn+4 at a location four stage after, is input as the reset signal R.

The operation period of the transistor ME whose gate is connected to the output node gn or qn, that is, the period during which the transistor ME is in the on-state, occurs only in the bootstrap period, which is shorter by the set period than in the case of the operation of the shift register SR shown in FIG. 4. Therefore, a ripple of the reset signal R may occur in the set period. However, the ripple is appropriately suppressed during the bootstrap period in which the ripple could be a problem, and thus the operational stability of the shift register SR is improved. Furthermore, compared with the operation of the shift register SR shown in FIG. 4, the operation period of the transistor ME is short, which makes it possible to minimize the device degradation of the transistor ME, and thus it is possible to achieve high circuit reliability.

Figure 11:
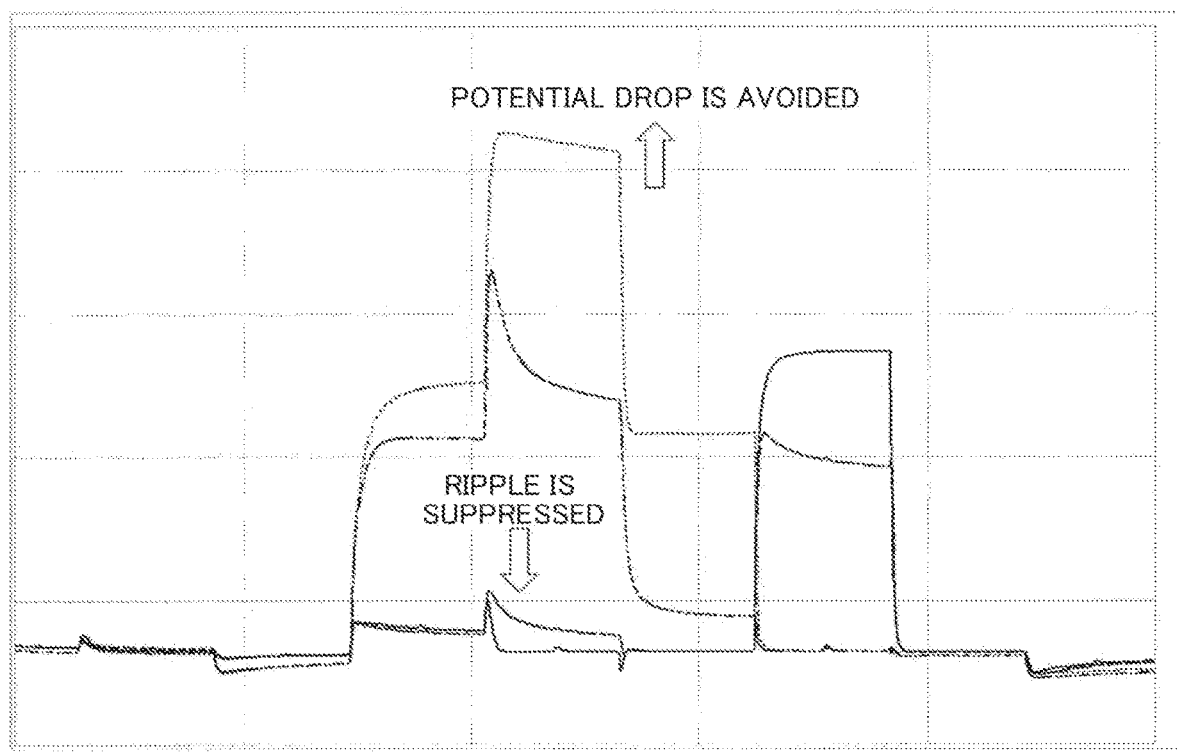
FIG. 11 is a graph illustrating a simulation result.

FIG. 11 is a graph showing a simulation result. In FIG. 11, a waveform of the reset signal R (Qn+4) is represented by a solid line, and a change in the potential of the internal node netA is represented by a dotted line. A simulation result is also shown, as a comparative example, for a case where the shift register SR does not have the stabilization circuit SC including the transistor ME. A waveform of the reset signal R in the comparative example is represented by a dashed line, and a change in the potential of the internal node netA is represented by a double-dotted line.

In the comparative example, a large ripple occurs on the reset signal R1 in the charging period, which results in a large drop in the potential at the internal node netA. In contrast, in the case where the stabilization circuit SC according to the present embodiment is provided, the ripple occurring on the reset signal R is suppressed, and as a result, the drop in the potential at the internal node netA is properly suppressed.

Second Embodiment

In a second embodiment, each shift register SR of a shift register circuit 50 further includes a sixth transistor MF.

Hereinafter, the sixth transistor MF is referred to simply as the "transistor MF". The transistor MF has a function of lowering the potential at the output node gn or qn down to the reference potential after the bootstrap period thereby causing the output signal Gn or the drive signal Qn to steeply fall dawn. In this falling operation, the reset signal output from the shift register SR at the following stage is used. The transistor MF enables it to achieve high-definition and high-speed drive in displaying. In the following description, explanations of similar points in the configurations and functions of the shift register SR according to the first embodiment are omitted, and explanations will focus on different points.

Figure 12:
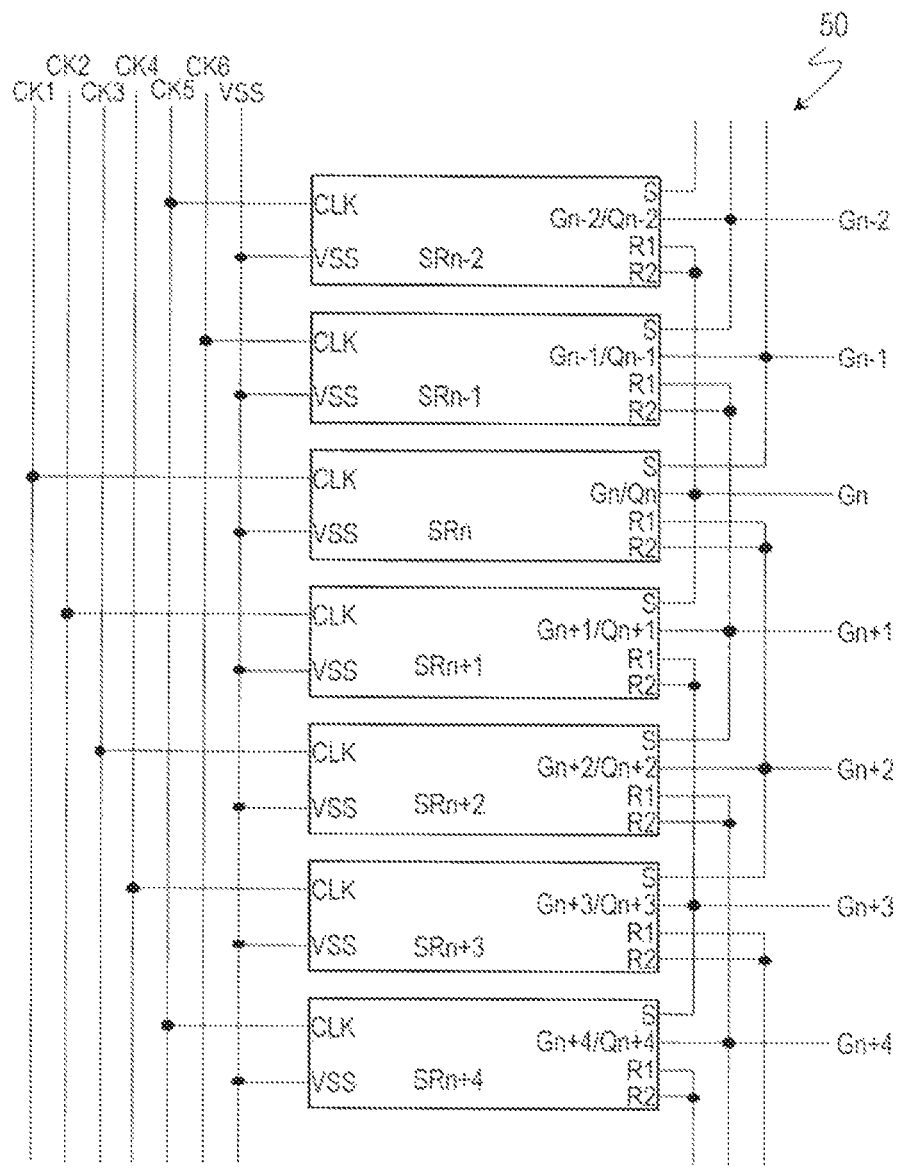
FIG. 12 is a circuit diagram illustrating an example of electrical connection of shift register groups in a shift register circuit according to a second illustrative embodiment.

FIG. 12 is a circuit diagram illustrating an example of electrical connection of shift register groups in the shift register circuit 50. In FIG. 12, in i shift register groups, seven shift registers SRs from (n−2)th to (n+4)th shift registers SR (n is an integer satisfying $3 \leq n \leq i-4$) are shown. The shift register SRn has input terminals including a clock terminal CLK, a reference voltage terminal VSS, a set terminal S, a first rest terminal R1, and a second reset terminal R2, and has output terminals including output terminals Gn and Qn. However, the output terminal Qn may not be provided as in the first embodiment. In FIG. 12, for convenience of explanation, the two output terminals Gn and Qn are illustrated as a common terminal shared by Gn and Qn. However, actually, each of them is provided as an individual terminal.

In the present embodiment, as in the first embodiment, six-phase clock signals CK1 to CK6 are used as clock signals input to the shift register circuit 50. To each shift register SR, an output signal or a drive signal output from a shift register SR of a different stage is input as a set signal S or reset signals R1 and R2. In the example shown in FIG. 12, the output signal Gn and the drive signal Qn from the shift register SRn are input as the first reset signal R1 and the second reset signal R2 to the shift register SRn−2 at a location two stages before the shift register SRn, and is also input as the set signal S to the shift register SRn+1 at a location immediately following the shift register SRn.

Figure 13A:
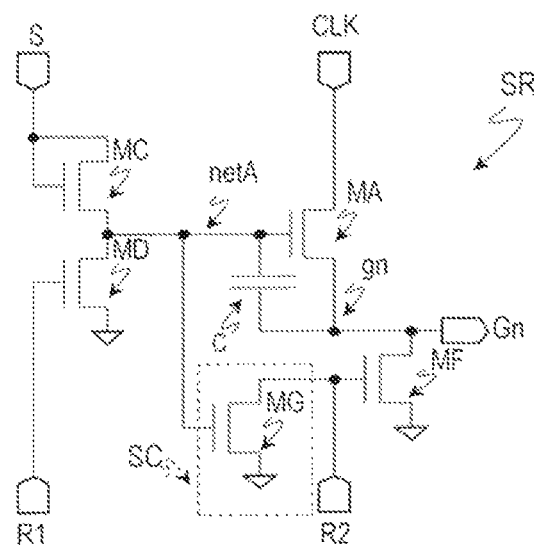
FIG. 13A is a circuit diagram illustrating an example of a configuration of a shift register according to the second illustrative embodiment.

FIG. 13A is a circuit diagram illustrating an example of a configuration of the shift register SR. The shift register SR in this embodiment includes the first reset terminal R1 electrically connected to the gate of the transistor MD and the second reset terminal R2 electrically connected to the gate of the transistor MF. Hereinafter, the first reset terminal R1 and the second reset terminal R2 are respectively referred to simply as the "reset terminal R1" and the "reset terminal R2". In the connection example shown in FIG. 12, the common output signal Gn+2 or drive signal Qn+2 is input to each of the reset terminals R1 and R2. However, the connection configuration is not limited to this example. A different output signal or drive signal output from a shift register SR of a different stage may be input to each of the reset terminals. That is, a reset signal different from the reset signal input to the gate of the transistor MF may be input to the gate of the transistor MD.

In the present embodiment, the shift register SR includes a transistor MC, a transistor MD, a transistor MA, a transistor MF, a capacitor C, and a stabilization circuit SC including a seventh transistor MG. Hereinafter, the seventh transistor MG is referred to simply as the "transistor MG". The transistor MG lowers a voltage level of the reset signal R2 input to the gate of the transistor MF down to the reference voltage during the charging period.

The gate of the transistor MF is electrically connected to the reset terminal R2. The drain of the transistor MF is electrically connected to the output terminal Gn (or the output node gn), and the source is electrically connected to the reference voltage source. In response to receiving the reset signal R2, the transistor MF lowers the potential of the output node gn. As a result, the output signal Gn falls down. By employing a transistor with a high drive capability as the transistor MF, it becomes possible to reduce the size of the transistor MA while maintaining the drive capability as the GOA circuit, which makes it possible to effectively reduce the parasitic capacitance associated with the clock signal. By reducing the parasitic capacitance associated with the clock signal, the GOA circuit with low power consumption and low heat generation can be achieved.

As already explained, it is possible to provide different reference voltages for the respective nodes. For example, the voltage of the reference voltage source connected to the source of the transistor MF for fixing the output node gn to the reference potential may be different from the voltage of the reference voltage source for fixing another node to another reference potential.

It is preferable to employ a transistor with a relatively large size as the transistor MF to ensure a sufficient driving capability. However, this may cause an increase in the ripple that may occur on the output signal Gn due to the transistor MF. In this embodiment, to suppress the ripple caused by the transistor MF, a transistor MG is provided in the shift register SR to suppress the ripple on the reset signal R2.

In the example of the circuit configuration illustrated in FIG. 13A, the gate of the transistor MG is electrically connected to the internal node netA. The drain of the transistor MG is electrically connected to the reset terminal R2, and the source is electrically connected to the reference voltage source. When the potential at the internal node netA is high, the transistor MG turns on, and the reset signal R2 is fixed to the reference voltage.

Figure 13B:
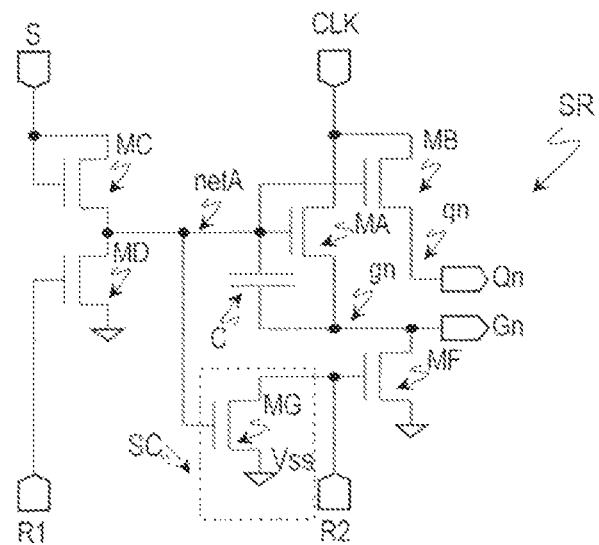
FIG. 13B is a circuit diagram illustrating another example of a configuration of a shift register according to the second illustrative embodiment.
Figure 13C:
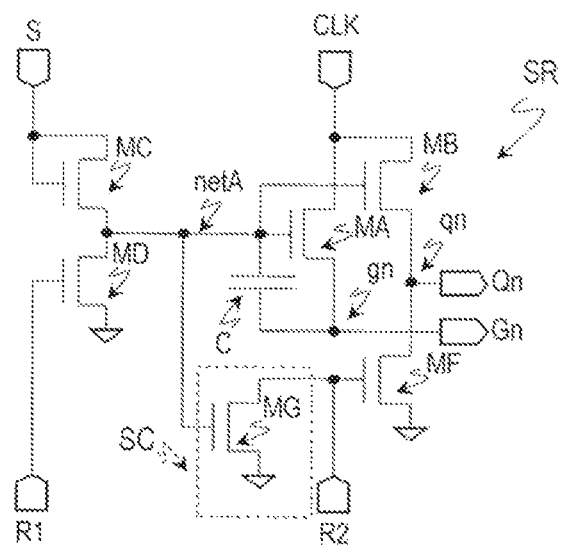
FIG. 13C is a circuit diagram illustrating another example of a configuration of a shift register according to the second illustrative embodiment.

FIG. 13B and FIG. 13C are each a circuit diagram illustrating another example of a configuration of the shift register SR. In the circuit configuration shown in FIG. 13B, the shift register SR has the output terminal Qn for outputting the drive signal Qn separately from the output terminal Gn. The output terminal Qn is as described above in the first embodiment. An eighth transistor MB is provided for outputting the drive signal Qn. The eighth transistor MB corresponds to the fifth transistor MB in the first embodiment. Hereinafter, the eighth transistor MB is referred to simply as the "transistor MB". In the circuit configuration shown in FIG. 13C, the shift register SR includes output terminals Gn and Qn and a transistor MB. In this configuration, the drain of the transistor MF is electrically connected not to the output terminal Gn but to the output terminal Qn. According to this configuration, by using a transistor with a high drive capability as the transistor MF, it becomes possible to reduce the size of the transistor MA while maintaining the drive capability as the GOA circuit, which makes it possible to effectively reduce the parasitic capacitance associated with the clock signal. As a result, it becomes possible to realize the GOA circuit with low power consumption and low heat generation.

Figure 14:
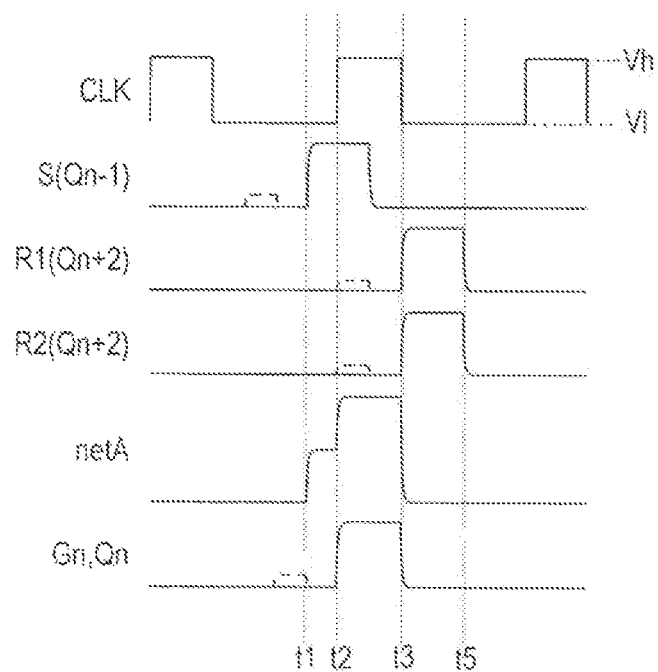
FIG. 14 is a timing chart illustrating an example of an operation of a shift register according to the second illustrative embodiment.

With reference to FIG. 14, an operation of the shift register SR according to the present embodiment is described in detail. FIG. 14 is a timing chart showing an example of an operation of the shift register SR of the shift register circuit 50 shown in FIG. 12. In this timing chart, the period of the high level Vh of the clock signal CLK is 2H. The duty ratio of the clock signal CLK is ⅓.

The drive signal Qn−1 output from the shift register SRn−1 at a location immediately before the shift register SR is input to the set terminal S of the shift register SR, and the drive signal Qn+2 output from the shift register SRn+2 at a location two stages after the shift register SR is input to the respective reset terminals R1 and R2. However, instead of the drive signal, an output signal may be input to each input terminal.

At time t1, the set signal S rises. This causes the transistor MC to turn on. As a result, the capacitor C is started to be charged. As in the first embodiment, the period from time t1 to time t2 is referred to as the "set period". When the clock signal CLK rises at time t2, bootstrapping occurs, and as a result, a high-level output signal Gn is output from the output terminal Gn. As in the first embodiment, the period from time t2 to time t3 is referred to as the "bootstrap period".

At time t3, the reset signals R1 and R2 rise, and the clock signal CLK falls. This causes the transistor MD and the transistor MF to turn on. As a result, the electric charge held in the capacitor C is discharged, and at the same time, the transistor MF makes the output signal Gn or the drive signal Qn steeply fall down. The potentials of the internal node netA and the output nodes gn and qn fall to the low level. A period from time t3 to time t5 is referred to as a "reset period".

In the present embodiment, when the output signal Gn is output, it is necessary to fix the reset signal R2 stably to the low level. However, the transistor MF has a parasitic capacitance, and the ripple represented by a dashed waveform in the timing chart of FIG. 14 may occur on the reset signal R2 due to the parasitic capacitance. The parasitic capacitance of the transistor MF causes a ripple to easily occur on the reset signal R2 when the potential at the output nodes gn and qn change.

FIGS. 13A to 13C are referred to again. In the present embodiment, the stabilization circuit SC includes the transistor MG that lowers the voltage level of the reset signal R2 input to the gate of the transistor MF down to the reference voltage during the charging period of the bootstrap capacitor. When the transistor MG is in the on-state, the transistor MG fixes the reset signal R2 to the reference voltage. Therefore, even if a ripple occurs on the reset signal R2 in the bootstrap period, the reset signal R2 is fixed at the low level when the transistor MG turns on, which avoids the transistor MF from turning on accidentally. As a result, the ripple is suppressed and the sufficient output signal Gn and drive signal Qn are obtained.

Figure 15:
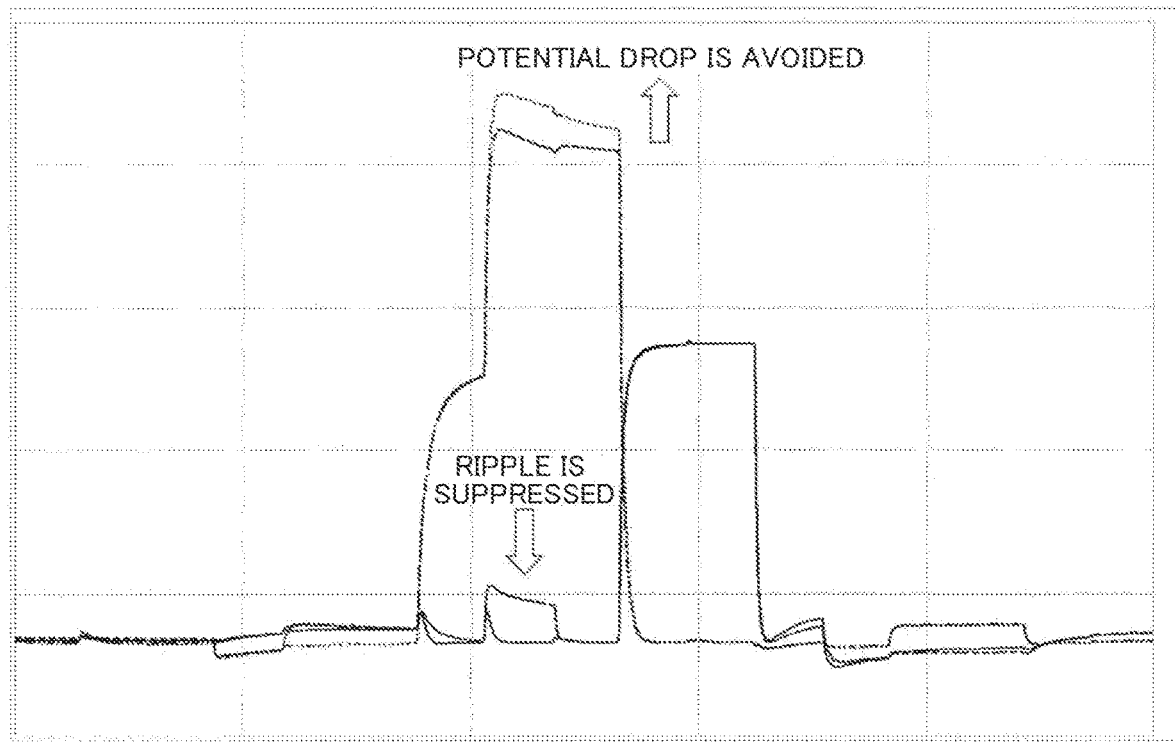
FIG. 15 is a graph illustrating a simulation result.

As in the first embodiment, the inventor verified the operation of the stabilization circuit SC according to the present embodiment using an electronic circuit simulator. FIG. 15 is a graph showing a simulation result. In FIG. 15, a waveform of the reset signal R2 is represented by a solid line, and a change in the potential at the internal node netA is represented by a dotted line. A simulation result is also shown, as a comparative example, for a case where the shift register SR does not have the stabilization circuit SC including the transistor MG. A waveform of the reset signal R2 in the comparative example is represented by a dashed line, and a change in the potential of the internal node netA is represented by a double-dotted line.

In the comparative example, when the potential at the internal node netA is raised by the bootstrapping, a ripple occurs on the reset signal R2. This results in a drop in the potential at the internal node netA. In contrast, in the case where the stabilization circuit SC according to the present embodiment is provided, the ripple occurring on the reset signal R2 at the above timing is suppressed, and as a result, the dropping in the potential at the internal node netA is properly suppressed.

Figure 16A:
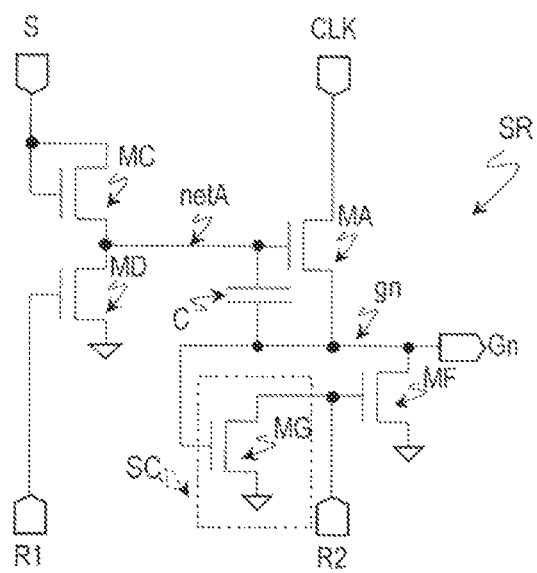
FIG. 16A is a circuit diagram illustrating still another example of a configuration of a shift register according to the second illustrative embodiment.
Figure 16B:
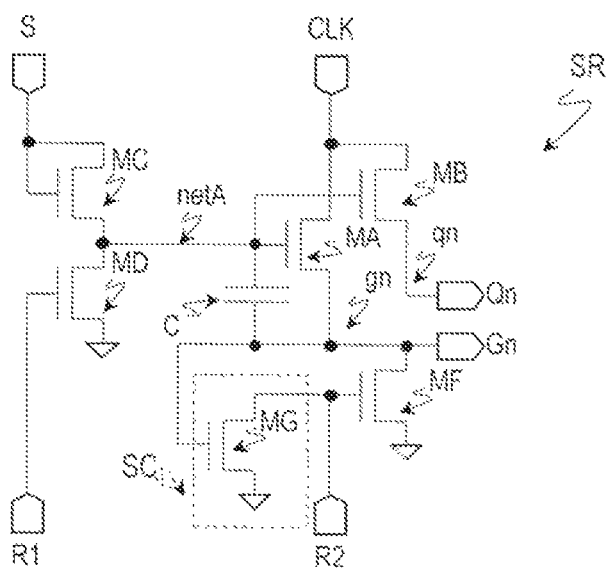
FIG. 16B is a circuit diagram illustrating still another example of a configuration of a shift register according to the second illustrative embodiment.
Figure 16C:
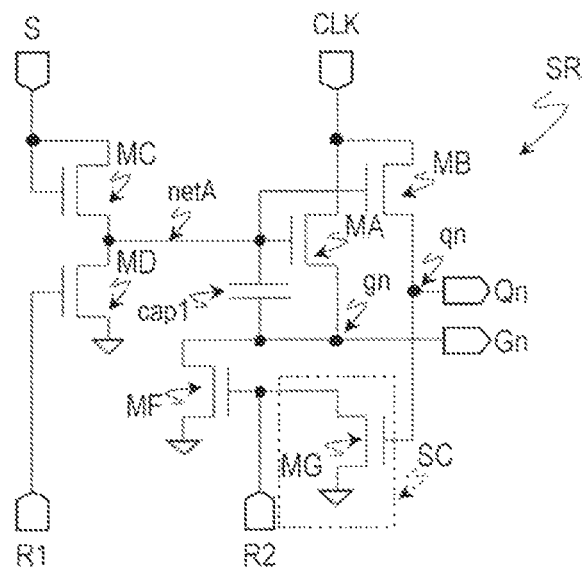
FIG. 16C is a circuit diagram illustrating still another example of a configuration of a shift register according to the second illustrative embodiment.

FIGS. 16A to 16C illustrate further examples of the circuit configuration of the shift register SR. In these examples of the configuration, the gate of the transistor MG is connected to the output node gn or qn. More specifically, in the example of the circuit configuration illustrated in FIG. 16A, the gate of the transistor MG is electrically connected not to the internal node netA but to the output node gn. In the circuit configuration illustrated in FIG. 16B, the gate of the transistor MG is electrically connected not to the internal node netA but to the output node gn, and furthermore, in this circuit configuration, the transistor MB, which outputs the drive signal Qn, is provided in the shift register SR. In the circuit configuration illustrated in FIG. 16C, the transistor MB, which outputs the drive signal Qn, is provided in the shift register SR, and the gate of the transistor MG is electrically connected not to the internal node netA but to the output node gn.

Figure 17:
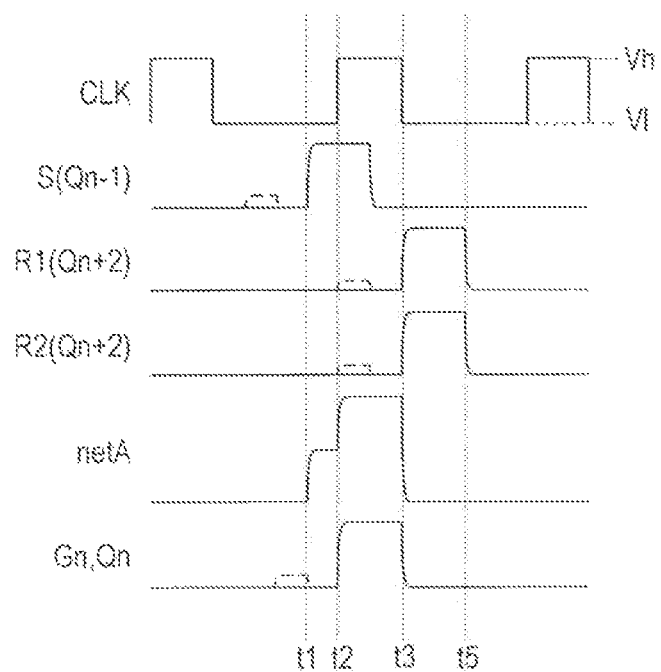
FIG. 17 is a timing chart illustrating another example of an operation of a shift register according to the second illustrative embodiment.

FIG. 17 is a timing chart showing an example of an operation of the shift register SR shown in FIG. 16A, FIG. 16B or FIG. 16C. In this example, the drive signal Qn−1 output from the shift register SRn−1 at a location immediately before the shift register SR is input to the set terminal 51 of the shift register SR, and the drive signal Qn+2 output from the shift register SRn+2 at a location two stages after the shift register SR is input to the respective reset terminals R1 and R2.

The operation period of the transistor MG whose gate is connected to the output node gn or qn, that is, the period during which the transistor MG is in the on-state, occurs only in the bootstrap period, which is shorter by the amount of the set period than in the case of the operation of the shift register SR shown in FIG. 14. The ripple is appropriately suppressed during the bootstrap period in which the ripple could be a problem, and the operational stability of the shift register SR is improved. Furthermore, compared with the operation of the shift register SR shown in FIG. 14, the operation period of the transistor MG is short, which makes it possible to minimize the device degradation of the transistor MG, and thus it is possible to achieve superior circuit reliability.

Figure 18:
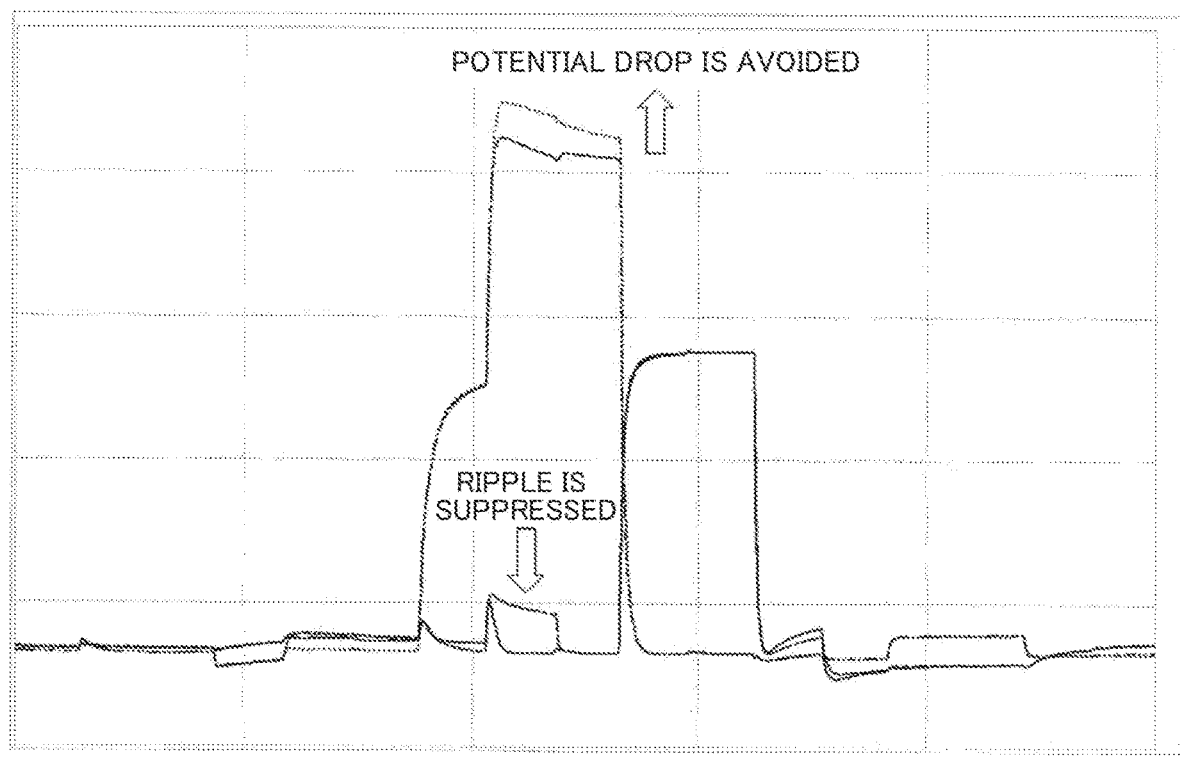
FIG. 18 is a graph illustrating a simulation result.

FIG. 18 is a graph showing a simulation result. In FIG. 18, a waveform of the reset signal R2 (Qn+2) is represented by a solid line, and a change in the potential at the internal node netA is represented by a dotted line. A simulation result is also shown, as a comparative example, for a case where the shift register SR does not have the stabilization circuit SC including the transistor MG. A waveform of the reset signal R2 in the comparative example is represented by a dashed line, and a change in the potential of the internal node netA is represented by a double-dotted line.

In the comparative example, a large ripple occurs on the reset signal R2 in the charging period, which results in a large drop in the potential at the internal node netA. In contrast, in the case where the stabilization circuit SC according to the present embodiment is provided, the ripple occurring on the reset signal R2 is suppressed, and as a result, the dropping of the potential at the internal node netA is properly suppressed.

The shift register circuit according to the present disclosure may be suitably used as a drive circuit for a display apparatus such as a liquid crystal display apparatus, an organic EL display apparatus, and the like.

The invention claimed is:

1. A shift register circuit comprising a plurality of stages configured to generate scanning signals to be supplied to a plurality of scanning lines of a display apparatus,
   a circuit of one of the plurality of stages comprising:
   a clock terminal for inputting a clock signal;
   a set terminal for inputting a set signal;
   a reset terminal for inputting a reset signal;
   a first output terminal for outputting a scanning signal;
   a first transistor having a gate, a source and a drain that are electrically connected such that the gate is electrically connected to the set terminal and one of the source and the drain is electrically connected to an internal node;
   a second transistor having a source and a drain that are electrically connected such that one of the source and the drain is electrically connected to the internal node and the other one of the source and the drain is electrically connected to a reference voltage source;
   a third transistor having a gate, a source and a drain that are electrically connected such that the gate is electrically connected to the internal node, one of the source and the drain is electrically connected to the clock terminal, and the other one of the source and the drain is electrically connected to the first output terminal;
   a bootstrap capacitor, one end of which is electrically connected to the internal node and the other end of which is electrically connected to the first output terminal; and
   a stabilization circuit configured to suppress a drop in potential at the internal node caused by a ripple on the reset signal in a charging period of the bootstrap capacitor, wherein
   the reset signal is input to a gate of the second transistor, and
   the stabilization circuit includes a fourth transistor to lower a voltage level of the reset signal to the reference voltage during the charging period, wherein
   the shift register circuit, further comprises
   a second output terminal configured to output a signal to drive a different stage at a same timing as a timing of outputting the scanning signal from the first output terminal, wherein the signal is output from a circuit of a certain stage of the plurality of stages and is input to a circuit of the different stage as a set signal or reset signal, and
   a fifth transistor having a gate, a source and a drain that are electrically connected such that the gate is electrically connected to the internal node, one of the source and the drain is electrically connected to the clock terminal, and the other one of the source and the drain is electrically connected to the second output terminal,
   wherein a gate of the fourth transistor is electrically connected to the second output terminal or the internal node, one of a source and a drain of the fourth transistor is electrically connected to the reset terminal, and the other one of the source and the drain is electrically connected to the reference voltage source.

2. An active matrix substrate comprising the shift register circuit according to claim 1.

3. A display apparatus comprising the active matrix substrate according to claim 2.

* * * * *